United States Patent
Van Heelsbergen

[19]

[11] Patent Number: 5,861,749
[45] Date of Patent: Jan. 19, 1999

[54] MAGNETIC RESONANCE APPARATUS WITH PHASED MEASURING COIL SYSTEM

[75] Inventor: Teunis R. Van Heelsbergen, Eindhoven, Netherlands

[73] Assignee: U.S. Philips Corporation, New York, N.Y.

[21] Appl. No.: 768,478

[22] Filed: Dec. 18, 1996

[30] Foreign Application Priority Data

Jan. 19, 1996 [EP] European Pat. Off. ............. 96200133

[51] Int. Cl.⁶ .................................................. G01V 3/00
[52] U.S. Cl. .......................................... 324/322; 324/318
[58] Field of Search .................... 324/318, 322, 324/313, 314, 300, 311; 6000/410, 422, 421

[56] References Cited

U.S. PATENT DOCUMENTS

| | | | |
|---|---|---|---|
| 4,825,162 | 4/1989 | Roemer et al. | 324/318 |
| 4,943,775 | 7/1990 | Boskamp et al. | 324/322 |
| 5,256,971 | 10/1993 | Boskamp | 324/318 |
| 5,302,901 | 4/1994 | Snelton | 324/322 |
| 5,370,118 | 12/1994 | Vij et al. | 600/422 |
| 5,389,880 | 2/1995 | Mori | 324/318 |
| 5,457,386 | 10/1995 | Matsunaga et al. | 324/318 |
| 5,592,088 | 1/1997 | Matsunaga et al. | 324/318 |
| 5,594,337 | 1/1997 | Boskamp | 324/318 |

*Primary Examiner*—Louis Arana
*Attorney, Agent, or Firm*—Dwight H. Renfrew, Jr.

[57] ABSTRACT

Magnetic resonance apparatus includes an RF measuring coil system (12) for detection of magnetic resonance signals to be generated in an object to be examined, which measuring coil system includes an at least one-dimensional array (33) of contiguous surface coils (33a, . . . 33f) and means for decoupling the surface coils from one another, and a signal processing circuit (15) which is connected to the surface coils and includes a number of processing channels (49a, 49b, 49c) for processing RF signals generated by the surface coils. Between the surface coils (33a, . . . ,) and the signal processing circuit (15) there is arranged a combination circuit (13) which includes at least two adder units (45a, 45b, 45c), each adder unit having at least two inputs and one output (47a, 47b, 47c) and being arranged to add signals, presented to its input, with a predetermined mutual phase shift, and to make the signal resulting from the addition available on the output. Each input of the adder unit (45a, . . . ) is connected to one of the surface coils (33a, . . . ) and the surface coils connected to the inputs of one and the same adder unit constitute a contiguous part of the array (33). The output of each adder unit (45a, . . . ) is connected to one of the processing channels (49a, . . . ) of the signal processing circuit (15). As a result of these steps, the number of processing channels (49a, . . . ) can be substantially smaller than the number of surface coils (33a, . . . ). Consequently, the construction of the signal processing circuit (15) is comparatively simple and inexpensive.

7 Claims, 3 Drawing Sheets

MAGNETIC RESONANCE APPARATUS WITH PHASED MEASURING COIL SYSTEM

BACKGROUND OF THE INVENTION

1. Field of the Invention

The invention relates to a magnetic resonance apparatus which includes a first magnet system for generating a steady magnetic field, a second magnet system for generating gradient fields, an RF transmitter coil and an RF measuring coil system for detecting magnetic resonance signals to be generated in an object to be examined, said measuring coil system including an at least one-dimensional array of contiguous surface coils and means for decoupling the surface coils from one another, and a signal processing circuit which is connected to the surface coils and includes a number of processing channels for processing RF signals generated by the surface coils.

2. Description of the Related Art

An apparatus of this kind is known from U.S. Pat. No. 4,825,162. The surface coils in the known apparatus constitute, for example a one-dimensional or two-dimensional array, each surface coil being connected to a respective processing channel of the signal processing circuit. The advantage of this construction resides in the fact that the signal-to-noise ratio of the signal thus obtained is substantially higher than that in the case of a single surface coil having the same total surface area as said array of surface coils. This is of importance notably for the examination of large objects, because the use of a single, large surface coil would then necessitate very long measuring times so as to enable extraction of usable information still from the signal having a low signal-to-noise ratio. It appears from the cited document that the construction of each processing channel is comparatively complex. Therefore, the signal processing circuit becomes elaborate and expensive if the number of surface coils in the array is larger than, for example four or six. Consequently, the known apparatus is not very well suitable for the examination of very large objects, for example the complete torso of a patient.

SUMMARY OF THE INVENTION

It is an object of the invention to provide a magnetic resonance apparatus of the kind set forth which utilizes a comparatively simple signal processing circuit and is capable of examining comparatively large objects nevertheless. To achieve this, the apparatus in accordance with the invention is characterized in that between the surface coils and the signal processing circuit there is arranged a combination circuit which includes at least two adder units, each adder unit having at least two inputs and one output and being arranged to add signals, presented to the inputs, with a predetermined mutual phase shift, and to make the signal resulting from the addition available on the output, each input of the adder unit being connected to one of the surface coils and the surface coils connected to the inputs of one and the same adder unit constituting a contiguous part of the array, the output of each adder unit being connected to one of the processing channels of the signal processing circuit. The invention is based on the recognition of the fact that if a limited number of processing channels, for example four or six, is used for large objects, the size of the coils gives rise to comparatively strong couplings between the coils at the upper side of the object and those at the lower side of the object. The coupling between coils is problematic notably in the case of low field strengths, because the mutual influencing is dependent on K.Q. Therein, K is the coupling factor which is independent of the field strength and Q is the quality of the coil loaded by a patient. Q rapidly increases in the case of low field strengths, for example from approximately 15 to 30 at 1.5 T to approximately from 45 to 90 at 0.5 T. This becomes highly problematic notably in the case of low field strengths (around 0.5 T) because these couplings cause a very strong decrease of the signal-to-noise ratio due to the coupling in of noise from one channel into the other. These couplings cannot or only hardly be reduced by way of known means, such as coil overlap or electronic decoupling circuits, because the degree of coupling is dependent on the position of the (flexible) upper part of the coil system relative to the (flexible) lower part, and hence is not predictable. In order to reduce such couplings, the use of smaller coils seems attractive; however, this would lead to an extension of the member of processing channels which is a very expensive solution which also requires a long calculation time. The invention provides for the electronic addition of the signals from the small coils, with a suitably chosen phase shift, so that fewer processing channels are required. The number of processing channels may amount to, for example one half or less than one half of the number of surface coils. The advantage of weak coupling between coils which cannot be suitably decoupled otherwise is thus combined with the advantage of a limited number of processing channels.

It is an additional advantage that the phase shift can be chosen so that the signal obtained by addition has an optimum signal-to-noise ratio. An embodiment of the apparatus which utilizes this possibility is characterized in that the phase shift is chosen so that the signal obtained by addition has a maximum signal-to-noise ratio for signals originating from a point in a region of importance in the object to be examined which is situated further from the relevant surface coils than the other points in the region of importance. This is important notably if objects must be examined which are situated comparatively deeply within the body of a patient. The phase shift is then chosen so that the signal-to-noise ratio is maximum for objects situated at a large distance from the relevant surface coil. This ratio is slightly less than maximum in the vicinity of the surface coils, but that is not objectionable because the signals from the direct vicinity of the surface coil are inherently much larger than noise any way. Therefore, a slight deterioration of the signal-to-noise ratio can be readily accepted.

These and other aspects of the invention will be apparent from and elucidated with reference to the embodiments described hereinafter.

DETAILED DESCRIPTION OF THE PREFERRED EMBODIMENTS

Figure 1:
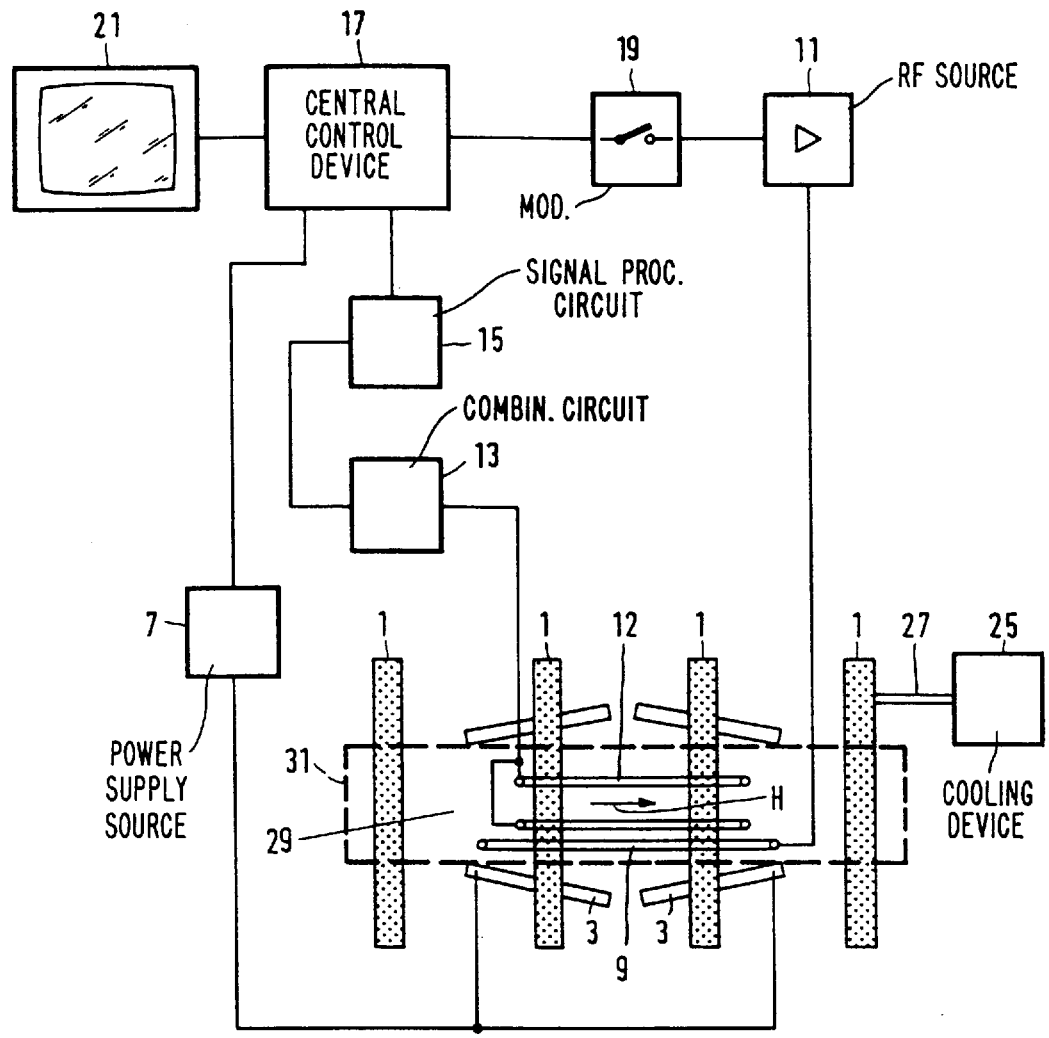
FIG. 1 shows diagrammatically an embodiment of a magnetic resonance apparatus according to the invention.

The magnetic resonance apparatus which is diagrammatically shown in FIG. 1 includes a first magnet system 1 for generating a steady magnetic field H, a second magnet system 3 for generating magnetic gradient fields, and a power supply source 7 for the second magnet system 3. An RF transmitter coil 9 serves to generate an RF magnetic alternating field and for this purpose is connected to an RF transmitter device with an RF source 11. For the detection of spin resonance signals generated in an object to be examined (not shown) by the RF transmitter field there is provided an RF measuring coil system 12 which is connected to an RF receiver device for this purpose; the RF receiver device includes a combination circuit 13 and a signal processing circuit 15 which is connected to a central control device 17. The central control device 17 also controls a modulator 19 for the RF source 11, the power supply source 7 and a monitor 21 for display of images reconstructed by signal processing circuit 15. A cooling device 25 with cooling ducts 27 is provided for cooling the magnet coils of the first magnet system 1. The RF transmitter coil 9 and the RF measuring coil system 12, being arranged within the magnet systems 1 and 3, enclose a measuring space 29 which is spacious enough to accommodate the patient to be examined, or a part of a patient to be examined, for example the head and the neck, in the case of an apparatus for medical diagnostic measurements. Thus, a steady magnetic field H, gradient fields for selection of object slices, and a spatially uniform RF alternating field can be generated within the measuring space 29. The RF transmitter coil and the RF measuring coil system may be enclosed, if desired, by a Faraday cage 31 shielding RF fields. The RF measuring coil system and the circuits connected thereto will be described in detail hereinafter with reference to the FIGS. 2 to 4.

Figure 2:
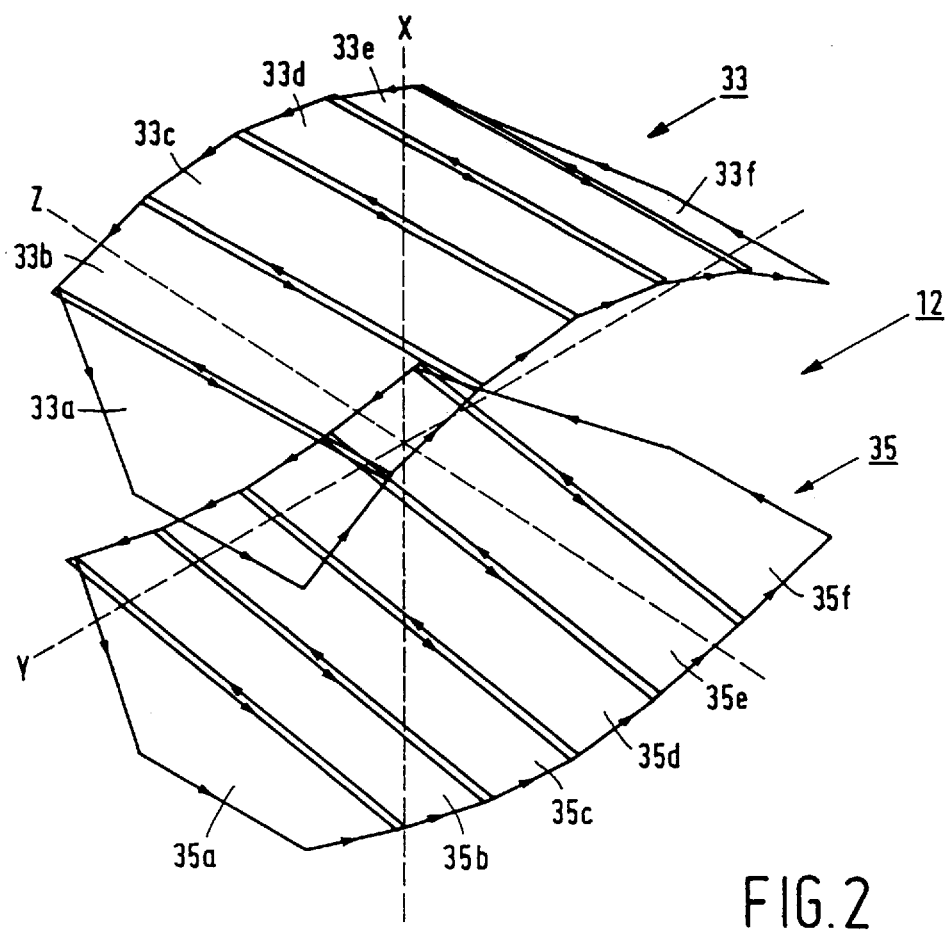
FIG. 2 is a diagrammatic perspective view of an embodiment of an RF measuring coil system for the apparatus shown in FIG. 1.

FIG. 2 is a diagrammatic perspective view of an embodiment of the RF measuring coil system 12. For the sake of orientation FIG. 2 also includes a rectangular coordinate system whose Z axis coincides with the direction of the steady magnetic field H in FIG. 1. The RF measuring coil system 12 shown includes two linear (one-dimensional) arrays 33 and 35 of six contiguous surface coils each, the individual coils of each array being denoted by the references 33a to 33f and 35a to 35f, respectively. This figure clearly shows that adjoining coils overlap over a given distance. This feature serves to decouple the surface coils from one another as explained in, for example U.S. Pat. No. 4,825,162 and U.S. Pat. No. 4,943,775 these patents are incorporated herein by reference in their entireties. If desired, other known means for decoupling the coils can also be used, for example the steps described in U.S. Pat. No. 5,302,901 this patent is incorporated herein by reference in its entirety can be taken. The two arrays of surface coils 33 and 35 are symmetrically situated relative to the Y-Z plane and enclose a part of the measuring space 29 (FIG. 1). This configuration is particularly suitable for examinations within a patient arranged in the measuring space 29, for example of the heart. Two-dimensional arrays of coils, for example as described in U.S. Pat. No. 4,825,162, are also useful for some examinations. The path of an electric current produced in each of the coils by magnetic resonance signals emitted by the object to be examined is denoted by arrows in the Figure. It is to be noted that the coils are only diagrammatically shown. As is known, in reality they include tuning means such as capacitors and connection conductors whereby they are connected to the combination circuit 13 and the signal processing circuit 15 which will be described in detail hereinafter with reference to FIG. 3.

Figure 3:
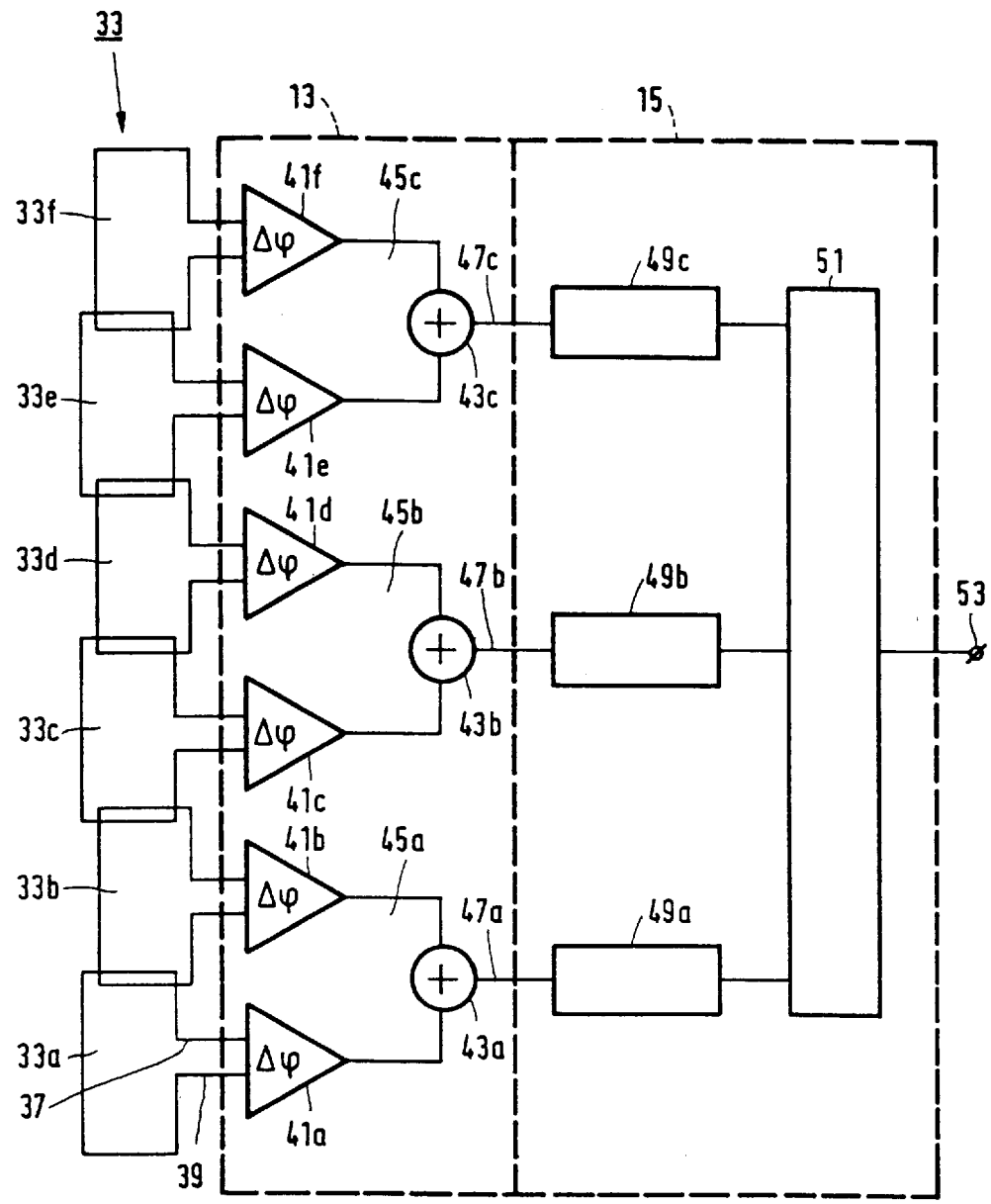
FIG. 3 shows a block diagram of an embodiment of a signal processing circuit for the apparatus shown in FIG. 1.

For the sake of clarity FIG. 3 shows only one of the arrays of surface coils (the array 33) of FIG. 2. However, this figure does show the connection conductors of the surface coils, for example the connection conductors 37 and 39 of the first surface coil 33a. The connection conductors 37 and 39 are connected to the two input terminals of a first phase-shifting amplifier 41a whose output terminal is connected to an input of a first summing circuit 43a which has two inputs in the present embodiment. The other input of the first summing circuit 43a is connected to the output terminal of a second phase-shifting amplifier 41b whose input terminals are connected to the connection conductors of the second surface coil 33b which is situated immediately adjacent the first surface coil 33a in the array 33. The first and second phase shifting amplifiers 41a and 41b constitute a first adder unit 45a in conjunction with the first summing circuit 43a. The two input terminals of the first phase-shifting amplifier 41a together constitute a first input of the first adder unit 45a and the input terminals of the second phase-shifting amplifier 41b together constitute a second input of the first adder unit. The first summing circuit 43a also includes an output 47a which at the same time constitutes the output of the first adder unit 45a.

Each phase-shifting amplifier 41a, 41b imparts a predetermined phase shift to the signal originating from the surface coil 33a, 33b connected to the relevant amplifier. As will be described in detail hereinafter, the phase shifts for adjoining surface coils are generally different, so that a phase shift is introduced between the signals originating from these coils. The adder unit 45a is thus arranged to add the signals presented to its inputs with a given mutual phase shift. The described adder unit may be replaced by an adder unit of different construction and capable of adding signals with a mutual phase shift. Such adder units are known per se and are used, for example for quadrature coils where a phase shift of 90° is customary. There are also provided second and third adder units 45b and 45c which are constructed in the same way as the first adder unit 45a and are also arranged to add signals presented to their inputs with a phase shift. The outputs of the second and third adder units 45b and 45c are denoted by the references 47b and 47c, respectively. The three adder units 45a, 45b and 45c together constitute the combination circuit 13.

The combination circuit 13 is succeeded by the signal processing circuit 15. This circuit may be a circuit which is known per se, for example a circuit as disclosed in U.S. Pat. No. 4,825,162. The signal processing circuit 15 includes three processing channels 49a, 49b and 49c which are connected to the outputs 47a, 47b and 47c, respectively, of the three adder units 45a, 45b and 45c, respectively. The signals processed by the three processing channels 49a, 49b, 49c are combined in an output stage 51 and applied, via an output terminal 53, to the central control device 17 (FIG. 1).

It will be evident from the foregoing that the number of processing channels 49a, 49b, . . . is substantially smaller than the number of surface coils 33a, 33b. . . . Consequently, the signal processing circuit 15 is substantially simpler and less expensive than would be the case if each surface coil were connected directly to its own processing channel. For the RF measuring coil system 12 shown in FIG. 2, including twelve surface coils, only six processing channels are required if the adder units shown in FIG. 3 are used. This number can be reduced further by using adder units having more than two inputs. In that case, for example the surface coils 33a, 33b and 33c can be connected to a common adder unit, like the surface coils 33d, 33e and 33f, the surface coils 35a, 35b and 35c, and the surface coils 35d, 35e and 35f. Only a single processing channel is then required for each group of three coils. Evidently, other combinations of surface coils with an adder unit are also feasible, for example a combination of the coils 33a, 33b and 33c, a combination of the coils 33b, 33c and 33d, etc. In the latter case only four processing channels are required for the six coils of the first array 33.

Figure 4:
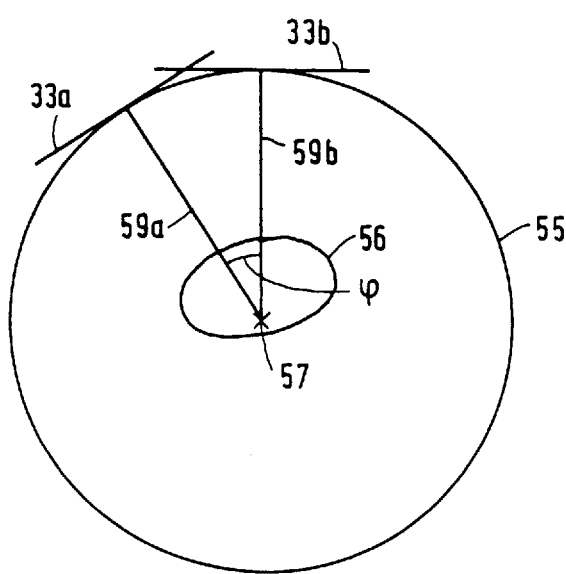
FIG. 4 illustrates the selection of the optimum phase shift.

FIG. 4 is a diagrammatic sectional view in the X-Y plane of an object 55 arranged in the measuring space 29 (FIG. 1), for example the body of a patient. Also shown are two of the surface coils 33a and 33b of the first array 33, which coils are arranged on the surface of the object 55. Let the region 56 of the object 55 be of importance for an examination to be performed, which region contains a point 57 which is situated approximately at the center of the object. The connecting lines 59a and 59b between the point 57 and the coils 33a and 33b, respectively, enclose an angle φ. Theoretically speaking, a maximum signal-to-noise ratio would be obtained if the phase shifting amplifiers 41a and 41b (FIG. 3) connected to the coils 33a and 33b were adjusted so that the signals of the two coils were subjected to a phase shift equaling φ relative to one another. This theoretical case is based on the assumption that the noise originating from the two coils 33a and 33b is fully non-correlated. However, it has been found in practice that a given degree of correlation exists between this noise. It has been found that a maximum signal-to-noise ratio is obtained by choosing the phase shift to be slightly larger than φ. The exact value of the phase shift yielding a maximum signal-to-noise ratio can be readily determined experimentally by arranging a suitable phantom in the measurement space 29.

It will be evident from the foregoing that the maximum signal-to-noise ratio can thus be adjusted only for the one point 57. For all points which are situated deeper or less deep within the object, viewed from the surface coils 33a, 33b, the signal-to-noise ratio will be less than the theoretical maximum. For points situated nearer to the surface coils 33a, 33b (i.e. the points situated less deeply), however, this is not objectionable because the useful signal is larger as the distance from the relevant surface coil is smaller. The signal-to-noise ratio near the surface of the object 55, therefore, is not maximum but very high nevertheless. An optimum situation is then achieved if the phase difference between the signals originating from the two surface coils 33a and 33b is chosen so that the signal-to-noise ratio is maximum for signals originating from the deepest point 57 in the region of importance 56 of the object 55 to be examined.

I claim:

1. A magnetic resonance apparatus comprising a first magnet system for generating a steady magnetic field, a second magnet system for generating gradient fields, an RF transmitter coil and an RF measuring coil system for detecting magnetic resonance signals to be generated in an object to be examined, said measuring coil system including an at least one-dimensional array of contiguous surface coils, wherein pairs of contiguous surface coils overlap at most partially, and means for decoupling the surface coils from one another other, and a signal processing circuit which is connected to the surface coils and includes a number of processing channels for processing RF signals generated by the surface coils, characterized in that between the surface coils and the signal processing circuit there is arranged a combination circuit which includes at least two adder units, each adder unit having at least two inputs and one output and being arranged to add signals, presented to the inputs, with a predetermined mutual phase shift, and to make the signal resulting from the addition available on the output, each input of the adder being connected to one of the surface coils and the surface coils connected to the input of one and the same adder unit constituting a contiguous part of the array, the output of each adder unit being connected to one of the processing channels of the signal processing circuit.

2. A magnetic resonance apparatus as claimed in claim 1, characterized in that the phase shift is chosen so that the signal obtained by addition has a maximum signal-to-noise ratio for signals originating from a point in a region of importance in the object to be examined.

3. A magnetic resonance apparatus as claimed in claim 1 wherein the predetermined mutual phase shift is adjustable.

4. A magnetic resonance apparatus as claimed in claim 1 wherein the means for decoupling the surface coils from one another comprises at most partial overlap of adjacent surface coils of the array of surface coils.

5. A magnetic resonance apparatus comprising a first magnet system for generating a steady magnetic field, a second magnet system for generating gradient fields, an RF transmitter coil and an RF measuring coil system for detecting magnetic resonance signals to be generated in an object to be examined, said measuring coil system including an at least one-dimensional array of contiguous and non-overlapping surface coils and means for decoupling the surface coils from one another other, and a signal processing circuit which is connected to the surface coils and includes a number of processing channels for processing RF signals generated by the surface coils, characterized in that between the surface coils and the signal processing circuit there is arranged a combination circuit which includes at least two adder units, each adder unit having at least two inputs and one output and being arranged to add signals, presented to the inputs, with a predetermined mutual phase shift, and to make the signal resulting from the addition available on the output, each input of the adder being connected to one of the surface coils and the surface coils connected to the input of one and the same adder unit constituting a contiguous part of the array, the output of each adder unit being connected to one of the processing channels of the signal processing circuit.

6. A magnetic resonance apparatus as claimed in claim 5, characterized in that the phase shift is chosen so that the signal obtained by addition has a maximum signal-to-noise ratio for signals originating from a point in a region of importance in the object to be examined.

7. A magnetic resonance apparatus comprising a first magnet system for generating a steady magnetic field, a second magnet system for generating gradient fields, an RF transmitter coil and an RF measuring coil system for detecting magnetic resonance signals to be generated in an object to be examined, said measuring coil system including an at least one-dimensional array of contiguous surface coils and means for decoupling the surface coils from one another other, and a signal processing circuit which is connected to the surface coils and includes a number of processing channels for processing RF signals generated by the surface coils, characterized in that between the surface coils and the signal processing circuit there is arranged a combination circuit which includes at least two adder units, each adder unit having at least two inputs and one output and being arranged to add signals, presented to the inputs, with a predetermined mutual phase shift, and to make the signal resulting from the addition available on the output, each input of the adder being connected to one of the surface coils and the surface coils connected to the input of one and the same adder unit constituting a contiguous part of the array, the output of each adder unit being connected to one of the processing channels of the signal processing circuit, wherein the predetermined mutual phase shift is chosen so that the signal obtained by addition has a maximum signal-to-noise ratio for signals originating from a point in a region of importance in the object to be examined which is situated further from the relevant surface coils that the other points in the region of importance.

* * * * *